(12) United States Patent
Shinma et al.

(10) Patent No.: US 7,279,048 B2
(45) Date of Patent: Oct. 9, 2007

(54) SEMICONDUCTOR MANUFACTURING APPARATUS

(75) Inventors: Kenji Shinma, Itami (JP); Hirohiko Nakata, Itami (JP); Masuhiro Natsuhara, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/987,304

(22) Filed: Nov. 15, 2004

(65) Prior Publication Data

US 2005/0170651 A1 Aug. 4, 2005

(30) Foreign Application Priority Data

Nov. 18, 2003 (JP) ............... 2003-387741

(51) Int. Cl.
*G01R 31/02* (2006.01)
*H01L 21/68* (2006.01)
*C23C 16/00* (2006.01)
*C23C 16/458* (2006.01)

(52) U.S. Cl. ............... 118/724; 118/725; 156/345.52; 156/345.53

(58) Field of Classification Search ............... 118/724, 118/725; 156/345.52, 345.53
See application file for complete search history.

(56) References Cited

U.S. PATENT DOCUMENTS

| 5,665,166 | A | * | 9/1997 | Deguchi et al. | 118/723 E |
|---|---|---|---|---|---|
| 6,072,163 | A | * | 6/2000 | Armstrong et al. | 219/497 |
| 6,963,052 | B2 | * | 11/2005 | Kuibira et al. | 219/444.1 |
| 2005/0160988 | A1 | * | 7/2005 | Shinma et al. | 118/725 |
| 2005/0170651 | A1 | * | 8/2005 | Shinma et al. | 438/689 |
| 2005/0178334 | A1 | * | 8/2005 | Shinma et al. | 118/725 |
| 2005/0274325 | A1 | * | 12/2005 | Kuibira et al. | 118/725 |

FOREIGN PATENT DOCUMENTS

| JP | 2003-506279 A | 2/2002 |
|---|---|---|
| JP | 2002-329566 A | 11/2002 |
| JP | 2003-100856 A | 4/2003 |
| JP | 2003-223971 A | 8/2003 |
| JP | 2004-014655 | 1/2004 |
| WO | WO 99/45745 | 9/1999 |

OTHER PUBLICATIONS

Japanese Office Action issued in corresponding Japanese Patent Application No. 2003-387741, dated Dec. 5, 2006.

* cited by examiner

*Primary Examiner*—Sylvia R. MacArthur
(74) *Attorney, Agent, or Firm*—McDermott Will & Emery LLP

(57) ABSTRACT

To provide a semiconductor manufacturing device, which is provided with a wafer holder capable of improving the cooling rate of a heater and retaining the homogeneity of the temperature distribution of the heater at cooling time and which can markedly shorten the time period for treating a semiconductor wafer.

The wafer holder includes the heater 1 for carrying the semiconductor wafer thereon to heat the same, and the cooling block 2 for cooling the heater 1. The cooling block 2 is arranged so as to come into and out of abutment against the back 1b of the heater on the side opposed to the wafer carrying face 1a, and its abutment face 2a to abut against the heater 1 has a warpage of 1 mm or less. The cooling block 2 can be provided therein with a passage for a cooling liquid. It is preferred that the passage has a sectional area of 1 mm$^2$ or larger over 80% of its entire length, and that the area of the portion having the passage formed is 3% or larger of the entire area of the abutment face 2a.

17 Claims, 3 Drawing Sheets

SEMICONDUCTOR MANUFACTURING APPARATUS

TECHNICAL FIELD

The present invention relates to a semiconductor manufacturing device such as a plasma-assisted CVD, a low-pressure CVD, a metal CVD, a dielectric-film CVD, an ion-implantation, an etching, a Low-K film heat treatment, a degassing heat treatment device, and a coater-developer, and, more particularly, to a semiconductor manufacturing device provided with a wafer holder for carrying a semiconductor wafer thereon to heat the same for predetermined treatments.

BACKGROUND ART

In the prior art, the semiconductor wafer is subjected to many treatments including various film deposition treatments, etching treatments and photolithography. In these treatments, the semiconductor wafer is placed on the wafer holder having a heater in the semiconductor manufacturing device so that while being heated it is subjected to the film deposition treatment and others. For these treatments, various wafer holders have been investigated for those individual treatments.

At the photolithography step of forming a resist film pattern on the wafer, for example, the wafer is rinsed, heated, dried and cooled. A resist liquid is then applied to the wafer surface and is dried. Subsequently, the resist is subjected to an exposure, a development and so on. In this photolithography step, the quality of the coating film is seriously influenced by the temperature at the resist drying time. It is, therefore, important to keep a homogeneous and constant temperature at the treating time. On the other hand, the treating device using a metal heater is hindered by a problem in which multiple particles stick to the semiconductor wafer.

Moreover, those treatments of the semiconductor wafer must be completed within the shortest possible time period so as to achieve maximum throughput improvement. To meet this demand to shorten the wafer treating time period, we have proposed a heater module for the semiconductor manufacturing device (as referred to in Japanese Patent Application No. 2002-163747), in which a block unit can come into and out of abutment against the back of the heater opposed to the wafer carrying face.

DISCLOSURE OF INVENTION

In order to shorten the time period for treating the semiconductor wafer, it is effective to use the wafer holder, to which is installed the block which can come into and out of abutment against the back of the heater on the side opposed to the wafer carrying face, as the wafer holder for carrying the semiconductor wafer thereon to execute the various treatments while heating the semiconductor wafer. By using this wafer holder, the heater cooling rate can be drastically improved to shorten the time period for treating the semiconductor wafer.

It has, however, been newly found that the temperature distribution of the heater becomes heterogeneous for the time period from the start to the finish of the cooling operation, if the cooling block is brought into abutment against the heater of the wafer holder. The wafer holder having such heterogeneous temperature distribution of the heater at the cooling time is restricted to the application in which the heterogeneity of the temperature distribution raises no obstruction. If the temperature distribution of the heater at the end of the cooling operation becomes heterogeneous, on the other hand, the time period for restoring the homogeneity of the temperature distribution of the heater after the end of the cooling operation is lengthened to offset the reduction of the treating time of the semiconductor wafer.

In view of this background, an object of the present invention is to provide a semiconductor manufacturing device, which is provided with a wafer holder for executing the various treatments of a semiconductor wafer being placed and heated thereon, and which can improve the cooling rate of a heater and can retain the homogeneity of the temperature distribution of the heater from the start to the end of the cooling operation so that it can drastically reduce the time period for treating a semiconductor wafer with the wafer holder.

In order to achieve the aforementioned object, according to the invention, there is provided a semiconductor manufacturing device comprising a wafer holder including a heater for carrying a semiconductor wafer thereon to heat the same, and a cooling block for cooling the heater. The semiconductor manufacturing device is characterized in that; the cooling block is so arranged as can come into and out of abutment against the back of the heater on the side opposed to the wafer carrying face; and in that the abutment face of the cooling block to abut against the heater has a warpage of 1 mm or less. It is preferred that the warpage of the abutment face of the cooling block to abut against the heater be 0.2 mm or less, and more preferred that the same be 0.05 mm or less.

In the semiconductor manufacturing device of the invention, the angle made between the abutment face of the cooling block and the back of the heater when the cooling block moves to contact with the heater is preferably 10° or less. In the semiconductor manufacturing device of the invention, moreover, it is preferred that the abutment face of the cooling block to abut against the heater be chamfered at its corners to 10 µm or larger.

In the semiconductor manufacturing device of the invention, the angle made between the abutment face of the cooling block and the back of the heater when the cooling block is separated from the heater and stands still is preferably 10° or less. In the semiconductor manufacturing device of the invention, it is preferred that, on the lines of intersection, where a cylindrical face, which has a center line normal to the wafer carrying face of the heater and extending through the center of the wafer carrying face and has a radius shorter than the distance from the center to the outer edge of the wafer carrying face, and an arbitrary plane, which is normal to the wafer carrying face and extends through the center of the wafer carrying face, intersect each other, the length from the wafer carrying face on that intersecting line to the container inner face of the semiconductor manufacturing device be within a range of 0.9 to 1.1 times as large as its average value.

In the semiconductor manufacturing device of the invention, it is preferred that the cooling block be provided therein with a passage for a cooling liquid. In the semiconductor manufacturing device of the invention provided with that passage, it is preferred that the passage have a sectional area of 1 mm² or larger over 80% of its entire length. It is further preferred that the area of the portion having the passage formed be 3% or larger of the entire area of the abutment face of the cooling block, against which the heater abuts, when viewed in the direction normal to the abutment face.

In the semiconductor manufacturing device of the invention provided with the aforementioned passage, it is preferred that the passage be formed within a range of 50 mm or less on the inner side of the outer edge of the abutment face of the cooling block, against which the heater abuts, when viewed in the direction normal to the abutment face. It is further preferred that the passage have a surface roughness within a range of 0.02 to 100 μm in terms of Ra on the face, with which the liquid contacts. It is further preferred that the liquid to be fed to the passage have a flow rate of 500 cc/min. or higher.

In the semiconductor manufacturing device of the invention, it is preferred that the material making the cooling block have a thermal conductivity of 30 W/mK or higher. It is further preferred that the same have a thermal conductivity of 100 W/mK or higher.

In the semiconductor manufacturing device of the invention, it is preferred that the material making the heater have a main component selected from any of the group consisting of aluminum nitride, aluminum oxide, silicon carbide and silicon nitride. It is further preferred that the material making the heater be composed mainly of aluminum nitride.

BEST MODE FOR CARRYING OUT THE INVENTION

Figure 1:
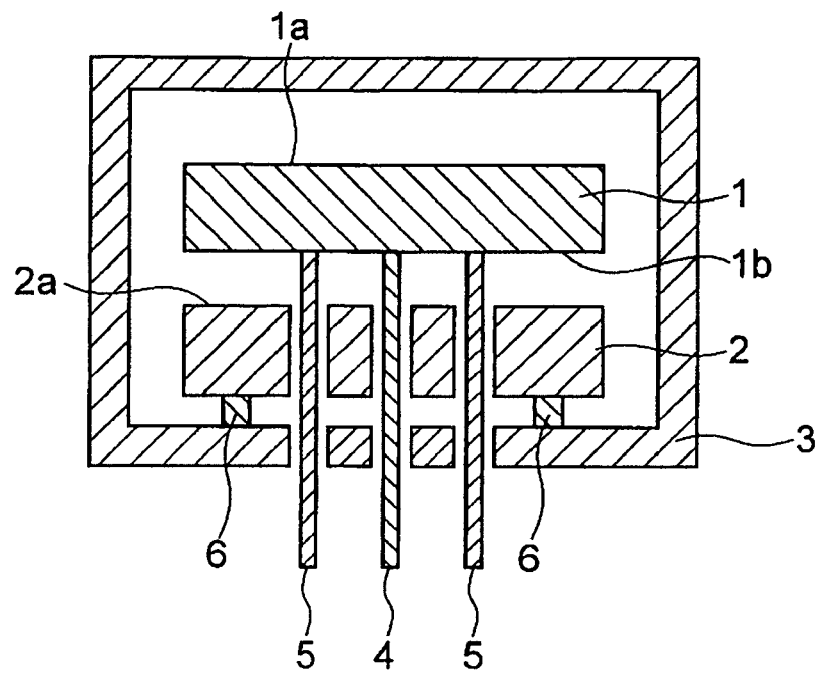
FIG. 1 is a schematic section of a semiconductor manufacturing device of the invention and shows the state in which a heater and a cooling block of a wafer holder are separated from each other.
Figure 2:
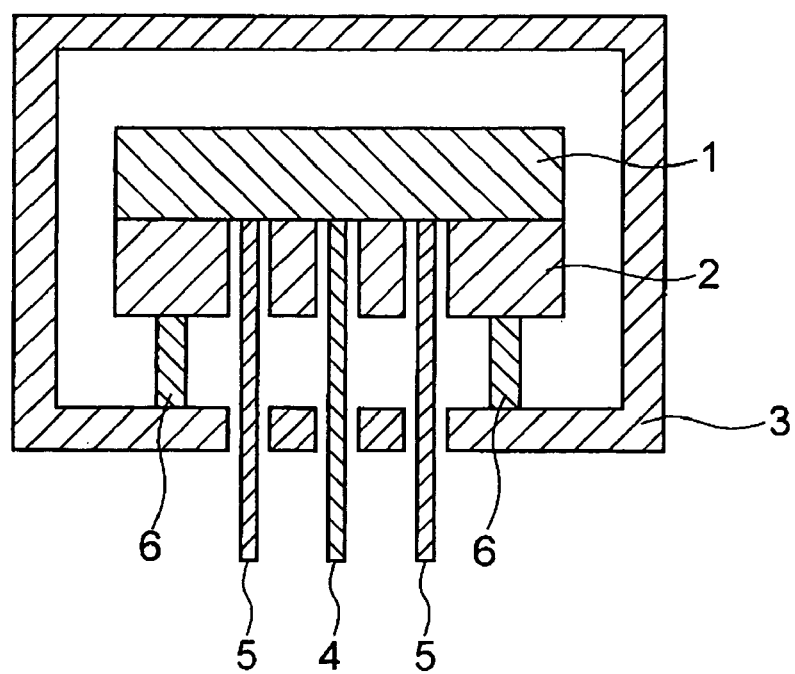
FIG. 2 is a schematic section of the semiconductor manufacturing device of the invention and shows the state in which the heater and the cooling block of the wafer holder abut against each other.

In the semiconductor manufacturing device of the invention, a wafer holder including a heater 1 for holding and heating a semiconductor wafer and a cooling block 2 for cooling the heater 1 is arranged in the container 3 of the device, as shown in FIG. 1 and FIG. 2, for executing various treatments while carrying and heating the semiconductor wafer. In this wafer holder, a thermocouple 4 and power lines 5 and 5 are attached to the heater 1 through the through holes of the cooling block 2 so that the heater 1 is heated to a predetermined temperature.

On the other hand, this cooling block 2 is so arranged by a plurality of drive shafts 6 and 6 as can move. By the drives of the drive shafts 6 and 6, moreover, the cooling block 2 can be brought into (i.e., the state of FIG. 2) and out of (i.e., the state of FIG. 1) abutment against the heater back 1b on the side opposed to the wafer carrying face 1a of the heater 1. For example, the cooling block 2 is brought out of abutment against the heater 1, as shown in FIG. 1, when the heater rises in temperature or maintains a high temperature, and is brought into abutment against the heater 1, as shown in FIG. 2, when the heater is cooled, so that the cooling rate of the heater 1 can be drastically improved.

In the wafer holder including the heater and the cooling block, as described above, according to the invention, the abutment face 2a (i.e., the face to abut against the heater back 1b) of the cooling block 2 has a warpage of 1 mm or less. It is effective for homogenizing the temperature distribution of the heater 1 at the cooling time (from the start to the finish of cooling) to set the warpage of the abutment face 2a of the cooling block 2 at 1 mm or less. In the case the homogeneity of the temperature distribution or the cooling rate is further raised, moreover, it is preferred to set the warpage of the abutment face of the cooling block at 0.2 mm or less, and it is more preferred to set the same at 0.05 mm or less. Generally, the warpage of a metallic sheet of a diameter of about 300 mm usually exceeds 1 mm for aluminum or its alloy excellent in thermal conductivity. In the cooling block of the prior art using such metallic sheet, the temperature distribution of the heater at the cooling time has a serious dispersion.

By setting the warpage of the abutment face 2a of the cooling block 2 at 1 mm or less, as described above, the cooling block 2 and the heater 1 contact the entire surface, and the heat is transferred from the heater 1 to the cooling block 2 so that the heater 1 can be homogeneously cooled down. When the warpage of the abutment face 2a of the cooling block 2 exceeds 1 mm, the cooling block 2 has portions to contact and not contact with the heater 1. At this time, the cooling rate necessarily drops at the portions of the heater 1 failing to contact with the cooling block 2 so that the temperature distribution of the heater 1 has a serious dispersion. The setting of the warpage of the abutment face of the cooling block 2 at 1 mm or less substantially increases the contact area between the cooling block 2 and the heater 1 so that the cooling rate of the heater 1 can also be improved.

In the wafer holder according to the invention, on the other hand, it is preferred that the angle made between the heater back and the abutment face of the cooling block be adjusted to 10° or less when the cooling block is moved to abut against the heater, that is, at the instant when the heater and the cooling block contact. The temperature distribution of the heater is most liable to become heterogeneous at the instant when the cooling block comes into contact. By setting the angle, as made between the heater back and the abutment face of the cooling block, at 100 or less, however, it is possible to effectively suppress the heterogeneity of the temperature distribution, which might otherwise be caused by the deviation of the contact timing in the abutment face.

Figure 4:
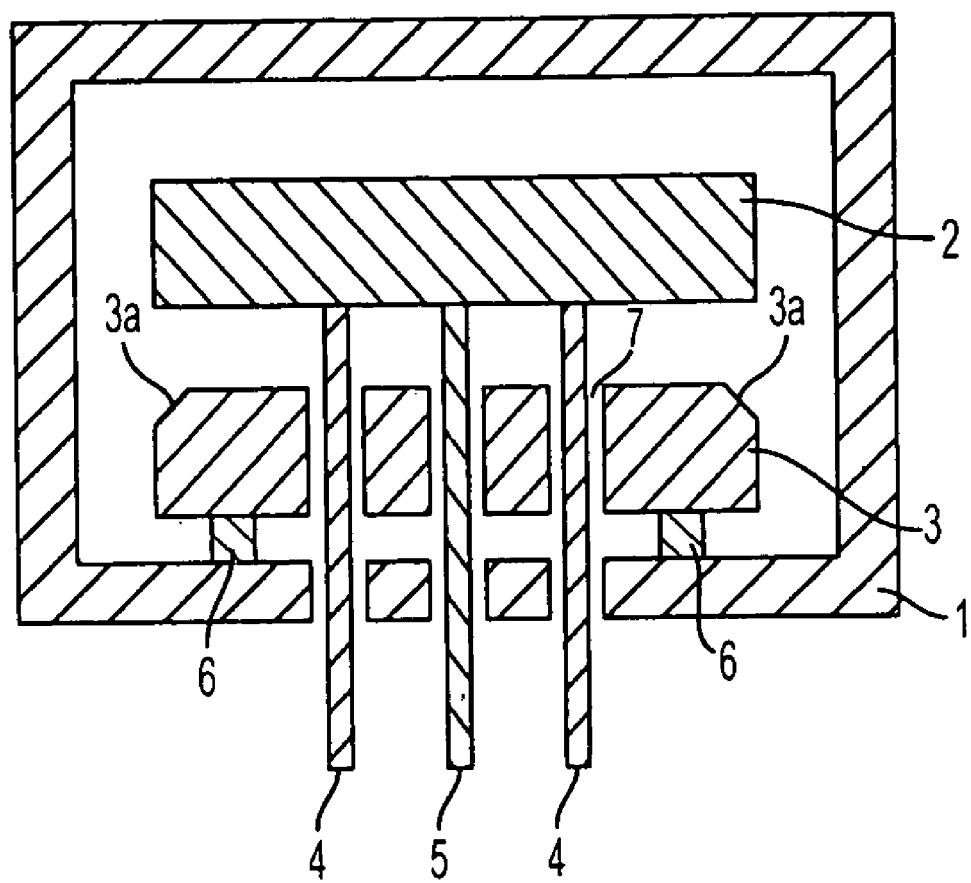
FIG. 4 is a schematic section of a semiconductor manufacturing device of the invention similar to FIG. 1, but illustrating chamfered corners of the cooling block.

Moreover, it is preferred to perform a chamfering of 10 gm or larger at the corners of the abutment face, against which the heater of the cooling block abuts. The corners of the cooling block are liable to be burred. The presence of burrs at the corners of the face to abut against the heater would be detrimental to the complete contact between the heater back and the abutment face of the cooling block. By removing the burrs by chamfering from the corners of the abutment face of the cooling block, therefore, would enable an extremely high homogeneity to be obtained at the contact between the heater back and the abutment face of the cooling block, and thereby to further improve the homogeneity of the temperature distribution of the heater and the cooling rate at the cooling time. FIG. 4 is similar to FIG. 1 and, hence, like reference characters denote like elements. In FIG. 4. the chamfered corners of the cooling block are illustrated by reference character 3a.

When the cooling block is separated from the heater and stands still, on the other hand, it is preferred that the angle made between the abutment face of the cooling block and the back of the heater be 10° or less. Depending on the application and the state of use of the heater, a problem is caused by such heterogeneity in the temperature distribution of the heater as is caused by a slight difference in the distance between the heater and the cooling block. At the portion in which the distance between the heater and the cooling block is short, more specifically, more heat is released than at the portion of a longer distance by the cooling block from the heater through the gas existing between the heater and the cooling block, so that the temperature of the heater drops at the portion of the shorter distance. This heterogeneity of the temperature distribution can be effectively suppressed by setting the angle, as made between the abutment face of the cooling block and the back of the heater, at 10° or less.

Moreover, relations such as those in the aforementioned between the abutment face of the cooling block and the back of the heater hold between the wafer carrying face of the heater and the confronting inner face of the container of the semiconductor manufacturing device. Ideally, the temperature distribution of the heater can be better homogenized by setting the angle, as made between the wafer carrying face of the heater and the inner face of the container of the semiconductor manufacturing device, at 10° or less. However, the inner face of the container of the semiconductor manufacturing device, which confronts the wafer carrying face of the heater, are not necessarily flattened by the limits which are caused by the design of the entire device. In the case the container inner face is not flat, therefore, on the lines of intersection, where a cylindrical face which has a center line normal to the wafer carrying face of the heater and extending through the center of the wafer carrying face and has a radius shorter than the distance from the center to the outer edge of the wafer carrying face, and an arbitrary plane, which is normal to the wafer carrying face and extends through the center of the wafer carrying face, intersect each other, the length from the wafer carrying face on that intersecting line to the container inner face of the semiconductor manufacturing device may be 0.9 to 1.1 times as large as its average value.

By this setting, the distance between the wafer carrying face of the heater and the container inner face of the semiconductor manufacturing device has a concentric distribution, and the manner for the heat to be released through the gas existing between the wafer carrying face and the container inner face is also concentric, so that the temperature distribution of the heater also becomes concentric. This concentric temperature distribution can be easily eliminated by the design of the heating element circuit pattern of the heater. For example, the portion where the temperature is concentrically low can be raised in its exothermic density to a high temperature by reducing the wiring width or the wiring interval of the heating element circuit pattern of the heater. On the contrary, the portion where the temperature is concentrically high can be lowered in its exothermic density to a low temperature by enlarging the wiring width or the wiring interval of the heating element circuit pattern of the heater. In the case where the container inner face of the semiconductor manufacturing device is not flat, therefore, the temperature distribution of the heater can easily be homogenized.

Here in the wafer holder of the invention having the aforementioned individual constructions, the higher thermal homogeneity raises the cost for realizing the constructions to the higher level. Therefore, these constructions may be appropriately selected and adopted according to the application and purpose of the wafer holder.

With a view to improving the cooling capacity and the throughput, the cooling block in the wafer holder of the invention can be fed therein with a cooling liquid. By feeding the liquid into the cooling block, the cooling capacity can be better improved to raise the cooling rate of the heater. In the case the treatments of the semiconductor wafer are continuously executed, moreover, the heat is accumulated to the cooling block gradually according to the executions so that the cooling capacity drops, even if the heater is continuously cooled with the cooling block. In this case, as well, the cooling capacity of the cooling block can be prevented from becoming gradually lower by feeding the cooling block with the liquid.

The cooling liquid to be fed into the cooling block is not especially limited but can be exemplified not only by water or an organic solvent such as Fluorinert™. In order to improve the cooling capacity, moreover, the liquid can also be cooled for use by a chiller. In the case the cooling liquid is fed into the cooling block, the passage for the liquid may be one line or a plurality of lines. Plural passages for the liquid can give a higher cooling capacity than that of the case of one line. By providing plural lines, however, the device is complicated. It is, therefore, desired that the number of lines may be selectively used according to the application and the purpose.

In the case the cooling block is fed therein with the liquid, it is natural that the cooling block is made to abut against the heater at the heater cooling time, but it is possible that the cooling block is always held in abutment against the heater even at times other than the cooling time. At the time of feeding the cooling block with the liquid, the liquid may or may not be introduced regardless of whether the cooling block might be in abutment against the heater, when the heater rises in temperature or maintains a high temperature. In the case of no liquid introduction, the peripheral parts of the heater rise in temperature so that some of them demanded a heat resistance, but the rising rate of the heater temperature increases so that the power consumption can be reduced. As the temperature of the heater rises, however, the temperature of the cooling block also rises so that the cooling rate drops slightly even if the liquid is fed after the heater cooling time. Considering this point, therefore, it is necessary to select, according to the application and the object, whether or not the liquid is to be fed even at the times of raising and maintaining the heater temperature.

In the case the cooling block is fed therein with the liquid, the temperature distribution of the heater from the start to the end of the cooling can be better homogenized by taking into consideration not only the contact between the heater and the cooling block but also the homogeneity of the temperature distribution of the cooling block. In the case the temperature of the cooling block is heterogeneous, more specifically, this heterogeneous temperature distribution is also naturally reflected on the heater to be cooled by the cooling block, it thereby invites the heterogeneity of the temperature distribution of the heater. If the temperature distribution of the cooling block can be homogenized, on the contrary, the homogeneity of the temperature distribution of the heater at the cooling time can be better improved.

The most preferred means of improving the homogeneity of the temperature distribution of the cooling block to be fed with the liquid is that in which the sectional area of the passage for the liquid to flow therein is 1 $mm^2$ or larger over 80% or more of the whole length of the passage. The temperature of the liquid to flow in the cooling block becomes higher at the passage outlet than at the passage inlet because the liquid flows while depriving the cooling block of heat. This temperature difference of the liquid between the inlet and the outlet of the passage is one of the causes of producing a heterogeneous temperature distribution of the cooling block. By setting the sectional area of the passage for the liquid to flow at 1 mm$^2$ or larger over 80% of the whole length of the passage, therefore, a sufficiently high flow rate can be retained for the liquid to flow in the cooling block so that the temperature difference of the liquid between the inlet and the outlet of the passage can be reduced. As a result, it is possible to improve the homogeneity of the temperature distribution of the cooling block.

Another effective means of improving the homogeneity of the temperature distribution of the cooling block to be fed with the liquid is one in which the passage is so formed that the area of the portion having the passage formed therein may be 3% or larger of the area of the abutment face of the cooling block, as viewed in the direction normal to the abutment face of the cooling block to abut against the heater. Even if the area of the passage occupying the abutment face of the cooling block is small, the homogeneity of the temperature distribution can be retained to some extent by the thermal conductivity of the material itself making the cooling block, but a slight temperature difference occurs between the positions close to and relatively apart from the passage. If the area of the passage occupying the abutment face of the cooling block is set at 3% or larger, the temperature difference depending on the location from the passage can be eliminated to realize a higher homogeneity on the temperature distribution of the cooling block.

Still another preferred means of improving the homogeneity of the temperature distribution of the cooling block to be fed with the liquid is one in which the passage is formed within a range of 50 mm from the outer edge of the abutment face of the cooling block to abut against the heater, as viewed in the direction normal to that abutment face. By thus forming the liquid feeding passage throughout the cooling block from the central portion to the outer edge portion, the cooling block can be cooled in its entirety with the liquid without any deviation so that the homogeneity of the temperature distribution of the cooling block can be better improved.

The passage for feeding the cooling block with the liquid can be formed by the following methods, for example. First, by spot-facing the surface of one sheet of block, a groove for the passage is formed, and a groove for inserting a seal member such as an O-ring is formed in the vicinity of the outer edge side of that passage. The O-ring or the like is inserted into that groove, and another sheet of block is laid on the surface of the aforementioned block and is fastened with screws to prepare the cooling block. This method is desirable from the view point that the shape of the passage can be freely formed by the working. On the other hand, the cooling block can also be prepared by jointing two sheets of blocks having grooves formed in their surfaces for the passage, by a welding or soldering method.

In connection with the passage thus formed, the surface roughness of the face to be contacted by the liquid in the passage is set within a range of 0.02 to 100 μm in terms of Ra (i.e., a center line average roughness), from the viewpoint of the cooling capacity of the cooling block. If the surface roughness Ra is less than 0.02 μm, the contact area between the liquid and the passage reduces so that the liquid cannot efficiently deprive the cooling block of the heat thereby to drop the cooling capacity of the cooling block. In the case the surface roughness Ra is more than 100 μm, on the contrary, the resistance to the liquid flowing in the passage rises to lower the flow rate and flow velocity of the liquid. As a result, the cooling capacity of the cooling block drops, and the temperature difference in the liquid between the inlet and outlet of the passage is enlarged to invite a deterioration in the homogeneity of the temperature distribution. Especially if the aforementioned surface roughness Ra is about 10 μm, the contact area between the liquid and the passage and the flow rate and flow velocity of the liquid are well balanced to provide such performances as are highly homogenous in the cooling capacity and the temperature distribution.

The flow rate of the liquid to be fed to the passage in the cooling block is desirably 500 cc/min. or higher. Although the heater can be effectively cooled even at a lower flow rate, a higher cooling capacity can be realized by setting the flow rate at 500 cc/min. or higher. Moreover, it is possible to suppress such a heterogeneity in the temperature distribution more effectively as might otherwise be caused due to the temperature difference between the inlet and outlet of the passage.

In connection with the material for the cooling block, the cooling block does not contact with the wafer directly unlike the heater. Therefore, adhesion of particles raises no problem so that the cooling block can be made of a metal. With a view to improving the homogeneity of the temperature distribution of the heater, however, the thermal conductivity of the cooling block is also important. In this point, the homogeneity of the temperature distribution of the heater can be kept high by using a material having a thermal conductivity of 30 W/mK or higher. In applications that demand an especially high homogeneity of the temperature distribution of the heater, a material having a higher thermal conductivity of 100 W/mK or higher can be used to realize an extremely high homogeneity in the temperature distribution of the heater.

Although various materials can be conceived for the heater, on the other hand, the use of a metal raises a problem in which multiple particles stick to the wafer. Ceramics therefore is desirable. Of the ceramics, aluminum nitride or silicon carbide having a high thermal conductivity is preferred for the homogeneity in the temperature distribution. In terms of reliability, silicon nitride is preferred because it has high strength and high resistance to thermal shock. In terms of cost, aluminum oxide is preferred. Of these, aluminum nitride is especially preferred considering the balance between the performance and the cost.

Next, a method of preparing the heater will be described in connection with the heater most preferably made of aluminum nitride. The aluminum nitride powder to be preferably employed as the material has a specific surface area of 2.0 to 5.0 m$^2$/g. The case of a specific surface area less than 2.0 m$^2$/g is undesirable because the sintering property of aluminum nitride drops. On the other hand, the case of a specific surface area more than 5.0 m$^2$/g is also undesirable because the agglomeration of powder becomes intense. The content of oxygen in the material powder of aluminum nitride is preferably 2 wt. % or less. The oxygen content in excess of 2 wt. % is undesirable because the thermal conductivity of the sintered intermediate drops. Moreover, the quantity of metallic impurities contained in the material powder, except aluminum, is preferred to be 2,000 ppm or less in total. Metallic impurities in excess of 2,000 ppm is undesirable because the thermal conductivity drops. Moreover, a IV-group element such as Si or an iron group element such as Fe is especially undesirable as metallic impurities because it acts to lower the thermal conductivity. The individual contents are preferred to be 500 ppm or less.

The aluminum nitride is a sintering retardant, and it is therefore preferable to add a generally employed sintering assistant. These sintering assistants react with the aluminum oxide or aluminum oxide-nitride existing on the surfaces of aluminum nitride particles to promote the densification of aluminum nitride, and trap oxygen acting as one factor for lowering the thermal conductivity of aluminum nitride, so that it acts to improve the thermal conductivity. The quantity of the sintering assistant is preferably in a range of 0.01 to 5.0 wt. %, as converted in oxides. The quantity of the sintering assistant to be added in less than 0.01 wt. % is undesirable not only because a sufficiently dense sintered intermediate is hard to obtain but also because the thermal conductivity becomes low. The addition of a sintering assistant in excess of 5.0 wt. % is undesirable because the sintering assistant existing in the particle boundaries is etched in a corrosive atmosphere to cause shattering or a particle formation in the case the heater is employed in the corrosive atmosphere.

The aforementioned sintering assistant is preferably exemplified by a rare earth metal element compound, especially by an yttrium compound having a high trapping ability to deprive the aluminum nitride of oxygen. Moreover, the rare earth element compound can be in the form of oxide, nitride, fluoride or stearate compound. Of these, the oxide has the advantage of being easily available at an especially low cost. On the other hand, the stearate compound is especially preferred, because it has a high affinity to an organic solvent so that its mixing property is high especially when the material powder and the sintering assistant are mixed with an organic solvent.

Predetermined quantities of solvents and binders and, if necessary, dispersions or deflocculation agents are added to the aforementioned material powder. These substances are mixed to form slurry. The mixing means may be a ball mill or ultrasonic. The slurry thus obtained is formed into a sheet by a doctor blade method. No special limitation is made on the sheet formation, but it is preferred to set the thickness of the sheet, after dried, at 3.0 mm or less. This is because the dry shrinkage of slurry may be increased to crack the sheet, if the sheet thickness exceeds 3.0 mm.

On the other hand, conductor paste preferred to be used for forming the heating element circuit pattern is preferably exemplified by a paste of a refractory metal such as tungsten, molybdenum or tantalum, because of its matching in a thermal expansion coefficient with the ceramics such as aluminum nitride making the heater. The conductor paste is prepared by mixing the powder sufficiently and by adding a binder and a solvent to the mixture. In order to retain the strength of bonding to the sintered intermediate of aluminum nitride, an oxide can be added to the paste. The oxide to be added may be such one as is wetted to both aluminum nitride and the aforementioned refractory metal, and is preferably specified by an oxide of IIA-group element or IIIA-group element, $Al_2O_3$ or $SiO_2$. Of these, yttrium oxide is especially preferred because it has very excellent wettability to aluminum nitride. The quantity of those oxides is preferably 30 wt. % or less.

In the case of a co-firing method (or co-metallizing method) for sintering the heating element circuit pattern simultaneously with the aforementioned sheet, the circuit pattern of the heating element is formed over the sheet by the screen printing method using that conductor paste. The heating element circuit pattern (of a metallic layer) at this time preferably has a dry film thickness of 5 to 100 μm. A film thickness of less than 5 μm is undesirable because the resistance is excessively high and because the bonding strength is low. On the other hand, a film thickness of more than 100 μm is also undesirable because the circuit pattern causes a reduction in the bonding strength. Simultaneously with the formation of the heating element circuit pattern, RF electrodes, electrostatic chucking electrodes and so on can be formed, if necessary, by the screen printing method.

In the case the heater is to be employed in the corrosive atmosphere, it must be buried in the aluminum nitride so that the heating element may not be corroded. For this necessity, the heating element circuit pattern is buried by laying another sheet having no circuit over the sheet having the aforementioned circuit formed therein. For example, the individual sheets are overlaid to sandwich the heating element circuit pattern and are integrated by applying a solvent, if necessary, between the individual sheets and by applying a pressure to them while heating them. The heating temperature is preferably about 150° C. or less, although the heating may be unnecessary because it determines the flexibility of the sheets prepared. This is because a higher temperature would seriously deform the sheets. The pressure to be applied is preferably within a range of 1 to 100 MPa, because the sheets are not sufficiently bonded to each other if the pressure is lower than 1 MPa, so that the so-called "de-lamination" is liable to occur at the degreasing or sintering step, and because the pressure exceeding 100 MPa deforms the sheets excessively.

The laminate obtained or the sheet having the aforementioned heating element circuit pattern formed therein is degreased in a non-oxidizing atmosphere at about 500 to 1,000° C. and is then sintered at about 1,700 to 2,000° C. The non-oxidizing atmosphere gas is exemplified by nitrogen or argon, of which the nitrogen is preferable because it is less expensive. Moreover, the moisture content in the nitrogen used is preferred to have a dew point of −30° C. or less. In the case of a higher moisture content, an oxide-nitride may be produced at the sintering time by the reaction between the aluminum nitride and the water content in the atmosphere thereby to cause a reduction in the thermal conductivity. Moreover, the oxygen contained in the nitrogen is preferred to be 0.001% or less for reasons similar to the aforementioned. A jig to be used for the sintering is preferably exemplified by a molding of boron nitride (BN). This BN molding is especially preferable not only because it has a heat-resisting temperature to the sintering but also because its surface has a solid lubricity so that it can reduce the friction among the jig, the molding and the laminate, when the molding is shrunken by the sintering, thereby to provide a sintered intermediate of less deformation.

In case the heating element is not buried in the aluminum nitride, the sintered intermediate obtained can be coated with an insulator except the portion to be connected with power feed terminals, so as to retain the insulation from the cooling block used. There are special restrictions regarding the coating material, if the material is an insulator having a low reactivity with the heating element and a thermal expansion coefficient difference of $5.0 \times 10^{-6}$/K or less from that of aluminum nitride. The coating material to be employed can be exemplified by crystallized glass or aluminum nitride. The coating can be formed by preparing those materials into a paste, for example, to form an insulating coating film of a predetermined thickness by screen printing, by degreasing the coating film in the non-oxidizing atmosphere of 500 to 1,000° C., and then by sintering the degreased film at a predetermined temperature.

The aforementioned sintered intermediate is subjected to a working treatment, if necessary, so that it may be used as the wafer holder of the semiconductor manufacturing device. The working precision preferably forms the wafer carrying face having a flatness of 0.5 mm or less, more preferably 0.1 mm or less. The flatness of the wafer carrying face in excess of 0.5 mm is undesirable, because a clearance may be formed between the wafer and the carrying face of the heater so that the heat generated by the heater may be heterogeneous when it is transferred to the wafer. On the other hand, the surface roughness of the wafer carrying face is preferably to be Ra of 5 µm or smaller, more preferably 1 micron or less. If the surface roughness Ra exceeds 5 µm, more grains of ceramics may be brought out of the heater by the friction between the heater and the wafer. In this case, the fallen off grains become particles thereby to affect the operations to form the film on the wafer or to etch the same. Needless to say, the surface roughness Ra of 1.0 micron or less is more preferable.

The method of preparing the heater is exemplified not only by the co-firing method (or co-metallizing method) for sintering the aforementioned heating element and the ceramics simultaneously but also by a post-firing method (or a post-metallizing method) for baking the heating element to the aluminum nitride sintered in advance. This post-firing method (or the post-metallizing method) will be described in the following.

The slurry containing the aluminum nitride and the sintering assistant is prepared, for example, by a method similar to the aforementioned. Granules are prepared from that slurry by means of a spray drier. These granules are inserted into a mold of a predetermined shape and are pressed. The pressing pressure at this time is preferably 9.8 MPa or higher. In the case of a lower pressure, the molding may not have sufficient strength so that it may be broken when handled. The preferred density of the molding is 1.5 g/cm$^3$, although it may be different depending on the binder content or the quantity of assistant to be added. A lower molding density is undesirable because the inter-particle distance becomes relatively large to make it hard for the sintering to proceed. On the other hand, the molding density is preferred to be 2.5 g/cm$^3$ or less. A higher molding density makes it difficult to remove the binder component sufficiently from the molding at the degreasing time. Therefore, excess carbon and carbon compounds remain in the molding to obstruct the sintering of the aluminum nitride so that a sintered intermediate of a sufficient density cannot be obtained.

This molding is degreased in a non-oxidizing atmosphere. In the case the molding is degreased in the oxidizing atmosphere such as the atmosphere, the surface of the aluminum nitride powder is oxidized to cause a reduction in the thermal conductivity of the sintered intermediate. On the other hand, the degreasing temperature is preferably 500 to 1,000° C. In the degreasing case at a temperature lower than such range, the binder component cannot be sufficiently removed so that excess carbon exists in the molding to block the sintering. If the quantity of the carbon existing in the molding after being completely degreased is 1.0 wt. % or more, the carbon and its compound in the molding undesirably block the sintering of aluminum nitride. The molding degreased is sintered in the non-oxidizing atmosphere at a temperature of about 1,700 to 2,000° C. as in the case of the aforementioned co-firing method.

The sintered intermediate obtained is subjected, if necessary, to the working treatment. Specifically, the sintered intermediate is preferred to have a surface roughness Ra of 5.0 µm or smaller so that the heating element circuit pattern may be formed at a subsequent step by the screen printing method. In the case of a higher surface roughness, a printing defect such as the bleeding of the pattern or the pin holes easily occurs when the circuit is formed by the screen printing method. A surface roughness Ra of 1.0 micron or less is more preferable. When the sintered intermediate is to be worked, moreover, it is preferred to work not only the printed face but also the two main faces. In the case one principal face is printed and in case the printed face is exclusively polished, the face left unpolished supports the semiconductor wafer. If projections or foreign particles exist on the unpolished face, therefore, the fixture of the wafer becomes unstable. It is, therefore, preferable to work the two faces within a range of the aforementioned surface roughness.

On the other hand, the parallelism of the two worked faces of the sintered intermediate is preferably 0.5 mm or less, and more preferably 0.1 mm or less. A parallelism exceeding 0.5 mm is undesirable because the dispersion of the film thickness becomes large when the heat element circuit pattern is screen-printed. Moreover, the parallelism of the printed face is preferably 0.5 mm or less, and more preferably 0.1 mm or less. This is because the dispersion of the film thickness is liable to occur at the time of screen-printing the heating element circuit pattern, if the parallelism of the printed face exceeds 0.5 mm.

After this, the heating element circuit pattern is formed on the completely worked sintered intermediate by the screen printing method. The conductor paste to be employed is similar to that of the case of the co-firing method. Specifically, the preferred metallic powder is exemplified by tungsten, molybdenum and tantalum. In order to retain the bonding strength to the sintered intermediate of aluminum nitride, it is possible to add an oxide of IIA-group element or IIIA-group element, or an oxide such as $Al_2O_3$ or $SiO_2$. The quantities of these oxides are preferably 0.1 to 30 wt. %. This is because the effect to improve the bonding strength to the ceramics is minimal if the oxide content is 0.1 wt. % or less, and because the resistance of the metallic layer is high if the oxide content exceeds 30 wt. %. The dry film thickness of the heating element circuit (or the metallic layer) is preferably 5 to 100 µm. A film thickness less than 5 µm is undesirable because the resistance becomes excessively high and because the bonding strength becomes low. A film thickness exceeding 100 µm is also undesirable because a reduction in the bonding strength is also caused. Along with the formation of the heating element circuit pattern, the RF electrodes, the electrostatic chucking electrodes and so on can be formed, if necessary, by the screen printing method.

The heating element circuit pattern formed is degreased in the non-oxidizing atmosphere. The treating temperature is preferably 500° C. or higher. If this temperature is lower, carbon may reside in the formed metallic layer to produce carbide with the refractory metal when sintered. The subsequent sintering treatment is executed in the non-oxidizing atmosphere at 1,500° C. or higher. A lower sintering temperature is undesirable because the grain growth of the refractory metal powder does not proceed to raise the resistance to an excessively high level. The sintering temperature preferably does not exceed the sintering temperature of the ceramics. This is because the sintering assistant contained in the ceramics begins to volatilize, in the case the metallic layer is sintered at a temperature exceeding the sintering temperature of the ceramics, so that the grain growth of the metallic powder in the metallic layer is promoted to degrade the bonding strength to the ceramics.

In order to retain the insulation between the heating element circuit patterns obtained, an insulating coating can be formed over the heating element circuit pattern. The insulating material to be employed is preferably to be identical to that of the ceramics of the sintered intermediate. This is because the ceramics of the sintered intermediate and the insulating coating naturally have different thermal expansion coefficients, if their compositions are drastically different, thereby to cause a warpage after the sintering operation. For example, the sintered intermediate is prepared, in the case it is made of aluminum nitride, by adding a predetermined amount of an oxide or carbonate of the IIA-group or IIIA-group as the sintering assistant to the aluminum nitride, by mixing them, by adding a binder or a solvent to the mixture into a paste, and by applying and sintering the paste by the screen printing method. The quantity of the sintering assistant for densifying and retaining the insulation between the heating element circuit patterns is preferably 0.01 wt. % or more. The quantity of the sintering assistant exceeding 20 wt. % is undesirable because the excessive sintering assistant penetrates into the metallic layer to change the resistance of the heating element. The insulating coating preferably has a film thickness of 5 μm or larger for attaining the target insulation.

Another sintered intermediate can also be bonded to the sintered intermediate of aluminum nitride, which is prepared by forming the heating element circuit pattern and, if necessary, by forming the insulating coating. By thus laminating and bonding the sintered intermediates, the heating element can be prevented from being corroded or oxidized, even in the case the heater is employed in the corrosive atmosphere or the oxidizing atmosphere. In the bonding method, an oxide or carbonate of the IIA-group or IIIA-group is added to the aluminum nitride powder, and a binder or a solvent is further added to the mixture into a paste. This paste is applied to the bonding face of the sintered intermediate by the screen printing method. The thickness of the bonding layer is not especially limitative, but is preferably 5 μm or larger. This is because the film thickness less than 5 μm may make the bonding layer thin to cause the bonding defect.

The coated paste is degreased in the non-oxidizing atmosphere at a temperature of 500° C. or higher. After this, the two sintered intermediates to be bonded are laid over each other and are heated in the non-oxidizing atmosphere and bonded to each other under a predetermined load. The load preferred at this time is 4.9 kPa. A lower load is undesirable because a sufficient bonding strength cannot be attained to cause the bonding defect such as the pin holes or the bonding heterogeneity easily. On the other hand, the bonding temperature may be sufficient for bonding the sintered intermediate and the bonding layer, and is preferably 1,500° C. or higher. A lower temperature is undesirable because a sufficient bonding strength cannot be obtained to cause the bonding defect. Moreover, the bonding atmosphere for preventing oxidation of ceramics is preferably the non-oxidizing atmosphere such as nitrogen or argon.

On the other hand, the insulating layer can also be formed, after the heating element circuit pattern has been formed over the sintered intermediate, by using the insulator such as the crystallized glass. In this case, the binder or organic solvent may be added to the predetermined glass powder to form a paste, and this paste may be applied so as to cover the heating element circuit pattern by the screen printing method. After degreasing, the paste may be sintered at a predetermined temperature.

EXAMPLE

The aluminum nitride (AlN) heater was prepared by the post-metallizing method. Specifically, 0.6 wt. parts of yttrium stearate was added as the sintering assistant to the material or 100 wt. parts of AlN powder having a specific surface area of 3.4 m$^2$/g and an average particle diameter of 0.6 μm. An organic solvent and a binder were further added, and the granules were prepared by the spray dryer. These granules were pressed and degreased in the nitrogen atmosphere at 70° C. The pressed intermediate was then sintered in the nitrogen atmosphere at 1,850° C. to prepare the aluminum nitride sintered intermediate. The aluminum nitride sintered intermediate thus obtained was worked to have a diameter of 330 mm and a thickness of 12 mm.

As the conductor paste for forming the heating element, 1.0 wt. parts of yttrium oxide powder was added to 100 wt. parts of tungsten powder, and the binder and the organic solvent were further added to form a pasty consistency. This conductor paste was applied to the aluminum nitride sintered intermediate by the screen printing method, and the printed intermediate was degreased in the nitrogen atmosphere at 900° C. and was then sintered in the nitrogen atmosphere at 1,800° C. Glass paste of $ZnO-B_2O_3-Al_2O_3$ was applied with a thickness of 100 μm to the sintered intermediate excepting the power feed portions, and the applied intermediate was sintered in the nitrogen atmosphere at 700° C. Moreover, W terminals were attached with Au solder to the power feed portions, and nickel electrodes were fastened to the W terminals by means of screws, thus completing the aluminum nitride heater.

Figure 3:
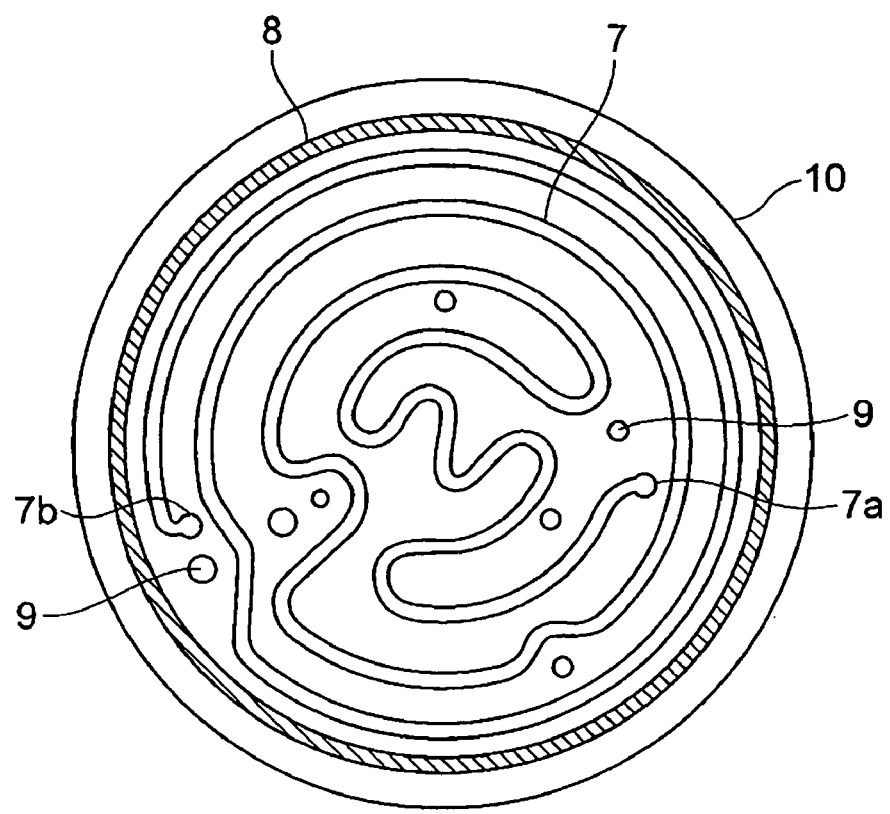
FIG. 3 is a schematic section of the cooling block according to the invention and shows the state of a passage formed in the cooling block.

Two aluminum sheets having a diameter of 330 mm and thicknesses of 12 mm and 7 mm were prepared as the cooling block. In the 12 mm thickness aluminum sheet 10 of these, as shown in FIG. 3, a groove having a width of 5 mm and a depth of 5 mm was worked to form a passage 7 for feeding a liquid. A groove having a width of 2 mm and a depth of 1 mm was formed on the outer side of that passage 7 and along the outer circumference of the aluminum sheet 10, and an O-ring 8 was inserted into that groove. On the two ends of the passage 7, there were formed through holes for a passage inlet 7a and a passage outlet 7b for respectively feeding and discharging the liquid. In order to insert the power lines for powering the heater and the thermocouples for measuring the temperatures of a plurality of portions of the heater, a plurality of through holes 9 are formed in the aluminum sheet 10. The aforementioned aluminum sheet of the thickness of 7 mm was fixed on the aluminum sheet 10 by means of screws to form the cooling block having the passage therein.

The aforementioned heater and cooling block were placed in a container of a predetermined shape, and drive shafts were attached to the cooling block and arranged to enable movement. The power lines and the plural thermocouples were attached to the heater through the through holes of the cooling block. The semiconductor manufacturing device thus constructed was used to perform the following examples. Here, the temperature distribution on the wafer carrying face of the heater was measured by placing a wafer thermometer on the wafer carrying face, and the difference between the maximum and the minimum of the measured values of the wafer thermometers was adopted as the temperature dispersion of the heater. At the cooling time, moreover, the time periods, for which the temperature of the heater dropped from 400° C. to 50° C., were measured with the thermocouples and adopted as the index of the cooling capacity of the cooling block.

Example 1

Used as the cooling block were the cooling blocks of Samples 1 to 10 individually having predetermined warpages on the abutment face, against which the heater abutted, as enumerated in the following Table I. When those cooling blocks contacted with the heater, the angles made between the abutment faces of the cooling blocks and the heater back were 5° or less, and the cooling blocks were chamfered to 100 μm at the corners of their abutment faces. When the cooling blocks were separated from the heater and were stationary, the angles made between the abutment faces of the cooling blocks and the back of the heater were 5°. On the lines of intersection, where a cylindrical face, which had a center line normal to the wafer carrying face of the heater and extending through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value.

After the heater had been heated to 400° C. as the measured value of the thermocouples, it was held at 400° C. for 30 minutes to stabilize the temperature. The power feed was then stopped, and the cooling blocks were brought into contact thereby to cool the heater to 50° C. The cooling blocks were not fed with the liquid while the heater was being fed with the power and being cooled. There were measured: the temperature dispersion of the wafer carrying face at the time when the measured value of the thermocouples reached 250° C.; the temperature dispersion of the wafer carrying face at the time when the measured value reached 50° C.; and the time period as the cooling capacity for the temperature to reach 50° C. from 400° C.

The results obtained are enumerated together with the warpages of the abutment faces of the cooling blocks in Table I. It is found that the homogeneity of the temperature on the wafer carrying face of the heater and the cooling capacity are highly improved across the warpages of 1.0 mm, 0.2 mm and 0.05 mm of the heater abutment faces of the cooling blocks.

TABLE I

| Sample number | Warpage of abutment face (mm) | Temperature dispersion (° C.) at cooling time at 250° C. | at 50° C. | Cooling capacity (secs.) |
|---|---|---|---|---|
| 1 | 0.02 | 1.5 | 0.2 | 1512 |
| 2 | 0.03 | 1.6 | 0.3 | 1527 |
| 3 | 0.05 | 1.6 | 0.3 | 1499 |
| 4 | 0.1 | 4.2 | 0.8 | 2465 |
| 5 | 0.15 | 4.4 | 0.9 | 2484 |
| 6 | 0.2 | 4.5 | 0.9 | 2503 |
| 7 | 0.5 | 8.3 | 1.6 | 3978 |
| 8 | 0.8 | 8.7 | 1.6 | 3992 |
| 9 | 1.0 | 8.6 | 1.7 | 4027 |
| 10 | 1.3 | 15.3 | 3.1 | 7685 |

Example 2

In the cooling blocks used, the abutment face, against which the heater abuts, had a warpage of 0.03 mm, and this abutment face was chamfered at its corners to 100 μm. When the cooling blocks were separated from the heater and were stationary, the angles made between the abutment faces of the cooling blocks and the back of the heater were 5°. On the lines of intersection, where a cylindrical face, which had a center line normal to the wafer carrying face of the heater and extending through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value. At this point, in Samples 11 to 14, the angles made between the abutment faces of the cooling blocks and the heater back when the cooling blocks contacted with the heater were set at angles enumerated in Table II.

As in Example 1, the heater temperature was raised to and held at 400° C. Simultaneously as the power feed was stopped, the cooling blocks were brought into contact thereby to cool the heater to 50° C. The cooling blocks were not fed with the liquid while the heater was being fed with the power and being cooled. The temperatures at the time when the heater temperature reached 390° C. in terms of the measured values of the thermocouples were measured to evaluate the temperature dispersion of the wafer carrying face at the time when the cooling blocks contacted with the heater.

The results obtained are enumerated in Table II together with the angles made between the abutment faces of the cooling blocks and the heater back at the time when the cooling blocks contacted with the heater. It is found that the temperature dispersion on the wafer carrying face of the heater is drastically reduced when the angles made between the heater back and the abutment faces of the cooling blocks at the time when the heater and the cooling blocks contacted with each other are 10° or less.

TABLE II

| Sample number | Angles (°) between heater and abutment face of cooling blocks | Temperature Dispersion (° C.) at cooling time at 390° C. |
|---|---|---|
| 11 | 2 | 3.2 |
| 12 | 5 | 3.3 |
| 13 | 10 | 3.3 |
| 14 | 15 | 7.2 |

Example 3

In the cooling blocks used, the abutment faces of the cooling blocks to abut against the heater were chamfered at their corners, as enumerated in Table III. At this point, the abutment faces of the cooling blocks, against which the heater abutted, had a warpage of 0.03 mm, and the angles made between the abutment faces of the cooling blocks and the heater back when the cooling blocks contacted with the heater were 5° or less. When the cooling blocks were separated from the heater and were stationary, the angles made between the abutment faces of the cooling blocks and the back of the heater were 5°. On the lines of intersection, where a cylindrical face, which had a center line normal to the wafer carrying face of the heater and extending through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value.

As in Example 1, the heater temperature was raised to and held at 400° C. Simultaneously as the power feed was stopped, the cooling blocks were brought into contact thereby to cool the heater to 50° C. The cooling blocks were not fed with the liquid while the heater was being fed with the power and being cooled. There were measured: the temperature dispersion of the wafer carrying face at the time when the measured value of the thermocouples reached 250° C.; the temperature dispersion of the wafer carrying face at the time when the measured value reached 50° C.; and the time period as the cooling capacity for the temperature to reach 50° C. from 400° C.

The results obtained are enumerated in Table III together with the chamfered extents of the abutment faces of the cooling blocks. It is found that the homogeneity of the temperature and the cooling capacity on the wafer carrying face of the heater are markedly improved for the chamfered extents of 10 μm or larger.

TABLE III

| Sample number | Chamfered extent (μm) | Temperature dispersion (° C.) at cooling time | | Cooling capacity (secs.) |
|---|---|---|---|---|
| | | at 250° C. | at 50° C. | |
| 15 | 5 | 2.8 | 0.8 | 2987 |
| 16 | 10 | 1.6 | 0.3 | 1548 |
| 17 | 20 | 1.6 | 0.3 | 1540 |
| 18 | 50 | 1.5 | 0.2 | 1522 |

Example 4

In the Samples used, the angles made between the abutment faces of the cooling blocks and the back of the heater were those enumerated in Table III when the cooling blocks were separated from the heater and were stationary. At this point, the abutment faces of the cooling blocks, against which the heater abutted, had a warpage of 0.03 mm, and the angles made between the abutment faces of the cooling blocks and the heater back when the cooling blocks contacted with the heater were 5° or less. The corners of the abutment faces of the cooling blocks were chamfered to 100 μm. On the lines of intersection, where a cylindrical face, which had a center line normal to the wafer carrying face of the heater and extending through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value.

After the heater had been heated to 400° C. as the measured value of the thermocouples, it was held at 400° C. for 30 minutes, and the temperature dispersion of the wafer carrying face was measured when the temperature was stabilized. The power feed was then stopped, and the cooling blocks were brought into contact thereby to cool the heater to 50° C. The cooling blocks were not fed with the liquid while the heater was being fed with the power and being cooled. There were measured: the temperature dispersion of the wafer carrying face at the time when the measured value of the thermocouples reached 250° C.; and the temperature dispersion of the wafer carrying face at the time when the measured value reached 50° C.

The results obtained are enumerated in Table IV together with the angles made between the abutment faces of the cooling blocks and the back of the heater when the cooling blocks are separated from the heater and are stationary. It is found that the temperature dispersion when the temperature is held at 400° C. is small and that its affects remain even during the cooling operation, when the angles made between the abutment faces of the cooling blocks and the back of the heater when the cooling blocks are separated from the heater and are stationary are 10° or less.

TABLE IV

| Sample number | Angles (°) between abutment face and heater back with cooling blocks separated | Temperature dispersion (° C.) held at 400° C. | Temperature dispersion (° C.) at cooling time | |
|---|---|---|---|---|
| | | | at 250° C. | at 50° C. |
| 19 | 2 | 0.2 | 1.5 | 0.2 |
| 20 | 5 | 0.3 | 1.6 | 0.3 |
| 21 | 10 | 0.3 | 1.6 | 0.3 |
| 22 | 15 | 1.0 | 2.0 | 0.5 |

Example 5

Samples prepared had dispersions, as numerated in Table V, from the following average at the maximum. On the lines of intersection, where a cylindrical face, which had a center line normal to the wafer carrying face of the heater and extending through the center of the wafer carrying face and had a radius shorter than the distance from the center to the outer edge of the wafer carrying face, and an arbitrary plane, which was normal to the wafer carrying face and extended through the center of the wafer carrying face, intersected each other, the average was that of the lengths from the wafer carrying face on that intersecting line to the container inner face of the semiconductor manufacturing device. At this time: the abutment faces of the cooling blocks, against which the heater abutted, had a warpage of 0.03 mm; the angles made between the abutment faces of the cooling blocks and the heater back when the cooling blocks contacted with the heater were 5° or less; the corners of the abutment faces of the cooling blocks were chamfered to 100 μm; and the angles made between the abutment faces of the cooling blocks and the back of the heater when the cooling blocks were separated from the heater and stood still were 5°.

After the heater had been heated to 400° C. as the measured value of the thermocouples, it was held at 400° C. for 30 minutes, and the temperature dispersion of the wafer carrying face when the temperature was stabilized was measured. The power feed was then stopped, and the cooling blocks were brought into contact thereby to cool the heater to 50° C. The cooling blocks were not fed with the liquid while the heater was being fed with the power and being cooled. There were measured: the temperature dispersion of the wafer carrying face at the time when the measured value of the thermocouples reached 250° C.; and the temperature dispersion of the wafer carrying face at the time when the measured value reached 50° C.

The results obtained are enumerated in Table V. It is found that the temperature dispersion when the temperature is held at 400° C. is small and that its affects remain even during the cooling operation, when the length from the wafer carrying face on the following lines of intersection to the container inner face of the semiconductor manufacturing device is 0.9 to 1.1 times as large as its average value. On the intersecting lines, a cylindrical face, which has a center line normal to the wafer carrying face of the heater and extends through the center of the wafer carrying face and has a radius shorter than the distance from the center to the outer edge of the wafer carrying face, and an arbitrary plane, which is normal to the wafer carrying face and extends through the center of the wafer carrying face, intersect each other.

TABLE V

| Sample number | Maximum dispersion (times) of length intersection line to average | Temperature dispersion (° C.) held at 400° C. | Temperature dispersion (° C.) at cooling time | |
|---|---|---|---|---|
| | | | at 250° C. | at 50° C. |
| 23 | 0.8 | 0.8 | 1.9 | 0.5 |
| 24 | 0.9 | 0.3 | 1.6 | 0.3 |
| 25 | 1.0 | 0.2 | 1.5 | 0.2 |
| 26 | 1.1 | 0.3 | 1.6 | 0.3 |
| 27 | 1.2 | 0.9 | 2.0 | 0.6 |

Example 6

In the cooling blocks used: the abutment faces of the cooling blocks, against which the heater abutted, had a warpage of 0.02 mm; the angles made between the abutment faces of the cooling blocks and the heater back when the cooling blocks contacted with the heater were 5°; the corners of the abutment faces were chamfered to 50 μm; and the angles made between the abutment faces of the cooling blocks and the back of the heater when the cooling blocks were separated from the heater and were stationary were 5°. On the lines of intersection, where a cylindrical face, which had a center line normal to the wafer carrying face of the heater and extended through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value.

In the cooling blocks, moreover, a passage was formed, which had a sectional area of 25 mm² over its entire length. The passage area (as viewed in the direction normal to the abutment faces against which the heater abutted, as in the following) in the abutment faces of the cooling blocks was 15% of the area of the abutment faces. Moreover, a passage was formed on the inner side of the position (as viewed in the direction normal to the abutment faces against which the heater abutted, as in the following) of 20 mm from the outer edges of the abutment faces of the cooling blocks, and had a surface roughness Ra of 0.2 μm on its face, with which the fluid therein contacted.

The cooling blocks were fed with water in the quantities enumerated in Table VI while the heater was heating and was being held and cooled. The heater was heated to 400° C. at a rate of 20° C./min. and was held at 400° C. for 30 minutes to stabilize the temperature. After this, the power feed was stopped, and the cooling blocks were brought into contact thereby to cool the heater to 50° C. There were measured: the temperature dispersion of the wafer carrying face at the instant when the measured value of the thermocouples reached 250° C.; the temperature dispersion of the wafer carrying face at the time when the measured value reached 50° C.; and the cooling capacity. At the time when the temperature reached 50° C., the cooling blocks were separated from the heater and were heated again to 400° C. at a rate of 20° C./min. These heating and cooling operations were repeated, and the cooling capacity was measured totally three times.

The results obtained are enumerated in Table VI together with the flow rates of cooling water fed to the passages in the cooling blocks. It is found that the homogeneity of the temperature on the wafer carrying face and the cooling capacity of the heater are markedly improved, and that the cooling capacity does not drop even if the heater is repeatedly heated and cooled, in the case the cooling water is fed at a flow rate of 500 cc/min. or higher.

TABLE VI

| Sample number | Water flow Rate (cc/min.) | Temperature dispersion (° C.) at cooling time | | Cooling Capacity | | |
|---|---|---|---|---|---|---|
| | | at 250° C. | at 50° C. | 1st | 2nd | 3rd |
| 28 | 0 | 4.8 | 1.0 | 1527 | 1740 | 1965 |
| 29 | 300 | 3.3 | 0.6 | 1065 | 1171 | 1283 |
| 30 | 500 | 1.6 | 0.3 | 728 | 735 | 737 |
| 31 | 1000 | 1.6 | 0.3 | 722 | 728 | 730 |

Example 7

In the cooling blocks used: the abutment faces of the cooling blocks, against which the heater abutted, had a warpage of 0.02 mm; the angles made between the abutment faces of the cooling blocks and the heater back when the cooling blocks contacted with the heater were 5°; the corners of the abutment faces were chamfered to 50 μm; and the angles made between the abutment faces of the cooling blocks and the back of the heater when the cooling blocks were separated from the heater and were stationary were 5°. On the lines of intersection, where a cylindrical face, which had a center line normal to the wafer carrying face of the heater and extended through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value.

In the cooling blocks, moreover, a passage was formed, in which a passage area in the abutment faces of the cooling blocks was 15% of the area of the abutment faces. The passage was formed on the inner side at the position of 20 mm from the outer edges of the abutment faces of the cooling blocks, and had a surface roughness Ra of 0.2 μm on its face, with which the fluid therein contacted. The cooling blocks were fed with water in a quantity of 1,000 cc/min. while the heater was heating and was being held and cooled.

The passage in the cooling blocks has a width of 5 mm and a depth of 5 mm (i.e., the sectional area of 25 mm²). Cooling blocks were used, in which the ratios of the passage having the sectional area of 1 mm² or larger to the entire length of the passage are enumerated in Table VII by changing the width and depth of a portion of the passage. After the heater had been heated to 400° C. as the measured value of the thermocouples, it was held at 400° C. for 30 minutes to stabilize the temperature. The power feed was then stopped, and the cooling blocks were brought into contact thereby to cool the heater to 50° C. There were measured: the temperature dispersion of the wafer carrying face at the time when the measured value of the thermocouples reached 250° C.; and the temperature dispersion of the wafer carrying face at the time when the measured value reached 50° C.

The results obtained are tabulated in Table VII together with the ratios of the passage having a sectional area of 1 mm$^2$ or larger to the entire length of the passage. It is found that the homogeneity of the temperature on the wafer carrying face of the heater is highly improved when the ratio of the passage of the sectional area of 1 mm$^2$ or larger to the entire length of the passage becomes 80% or more.

TABLE VII

| Sample number | Ratio (%) of passage having sectional area of 1 mm$^2$ or larger to entire length | Temperature dispersion (° C.) at cooling time | |
|---|---|---|---|
| | | at 250° C. | at 50° C. |
| 32 | 60 | 6.8 | 1.3 |
| 33 | 80 | 1.6 | 0.3 |
| 34 | 90 | 1.6 | 0.3 |
| 35 | 95 | 1.5 | 0.2 |

Example 8

In the cooling blocks used: the abutment faces of the cooling blocks, against which the heater abutted, had a warp age of 0.02 mm; the angles made between the abutment faces of the cooling blocks and the heater back when the cooling blocks contacted with the heater were 5°; the corners of the abutment faces were chamfered to 50 μm; and the angles made between the abutment faces of the cooling blocks and the back of the heater when the cooling blocks were separated from the heater and were stationary were 5°. On the lines of intersection, where a cylindrical face, which had a center line normal to the wafer carrying face of the heater and extended through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value.

In the cooling blocks, moreover, a passage was formed with a sectional area of 25 mm$^2$ over its entire length. The passage was formed on the inner side of the position of 20 mm from the outer edges of the abutment faces of the cooling blocks, and had a surface roughness Ra of 0.2 μm on its face, with which the fluid therein contacted. The cooling blocks were fed with water in a quantity of 1,000 cc/min. while the heater was heating and was being held and cooled.

The cooling blocks were used, which had the passages formed in their abutment faces to abut against the heater and in which the areas of the passages had the ratios, as enumerated in Table VIII, to the area of the abutment faces, as viewed in the direction normal to the abutment faces. After the heater had been heated to 400° C. as the measured value of the thermocouples, it was held at 400° C. for 30 minutes to stabilize the temperature. The power feed was then stopped, and the cooling blocks were brought into contact thereby to cool the heater to 50° C. There were measured: the temperature dispersion of the wafer carrying face at the time when the measured value of the thermocouples reached 250° C.; and the temperature dispersion of the wafer carrying face at the time when the measured value reached 50° C.

The results obtained are enumerated in Table VIII together with the ratios of the passage areas to the abutment face areas of the cooling blocks. It is found that the homogeneity of the temperatures on the wafer carrying face of the heater is highly improved when the ratios of the passage areas to the abutment face areas are 3% or higher.

TABLE VIII

| Sample number | Ratio (%) of passage area to abutment face area | Temperature dispersion (° C.) at cooling time | |
|---|---|---|---|
| | | At 250° C. | at 50° C. |
| 36 | 2 | 6.1 | 1.1 |
| 37 | 3 | 1.6 | 0.3 |
| 38 | 7 | 1.6 | 0.3 |
| 39 | 15 | 1.5 | 0.2 |

Example 9

In the cooling blocks used: the abutment faces of the cooling blocks, against which the heater abutted, had a warpage of 0.02 mm; the angles made between the abutment faces of the cooling blocks and the heater back when the cooling blocks contacted with the heater were 5°; the corners of the abutment faces were chamfered to 50 μm; and the angles made between the abutment faces of the cooling blocks and the back of the heater when the cooling blocks were separated from the heater and were stationary were 5°. On the lines of intersection, where a cylindrical face, which had a center line normal to the wafer carrying face of the heater and extended through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value.

In the cooling blocks, moreover, the passage was formed with a sectional area of 25 mm$^2$ over its entire length. The passage had an area 15% as large as that of the abutment face, and had a surface roughness Ra of 0.2 μm on its face, with which the fluid therein contacted. The cooling blocks were fed with water in a quantity of 1,000 cc/min. while the heater was heating and was being held and cooled.

The cooling blocks were used, which abutted on their abutment faces against the heater, and of which the shortest distances from the outer edges of the abutment faces to the passage were changed, as enumerated in Table IX, as viewed in the direction normal to the abutment faces. After the heater had been heated to 400° C. as the measured value of the thermocouples, it was held at 400° C. for 30 minutes to stabilize the temperature. The power feed was then stopped, and the cooling blocks were brought into contact thereby to cool the heater to 50° C. There were measured: the temperature dispersion of the wafer carrying face at the time when the measured value of the thermocouples reached 250° C.; and the temperature dispersion of the wafer carrying face at the time when the measured value reached 50° C.

The results obtained are enumerated in Table IX together with the shortest distances from the outer edges of the abutment faces of the cooling blocks to the passage. It is found that the homogeneity of the temperature on the wafer carrying face of the heater is highly improved when the shortest distance from the outer edges of the abutment faces of the cooling blocks to the passage was 50 mm or less.

TABLE IX

| Sample number | Shortest distance (mm) from outer edge of abutment face to passage | Temperature dispersion (° C.) at cooling time | |
|---|---|---|---|
| | | at 250° C. | at 50° C. |
| 40 | 10 | 1.5 | 0.2 |
| 41 | 30 | 1.6 | 0.3 |
| 42 | 50 | 1.6 | 0.3 |
| 43 | 90 | 4.5 | 1.3 |

Example 10

In the cooling blocks used: the abutment faces of the cooling blocks, against which the heater abutted, had a warpage of 0.02 mm; the angles made between the abutment faces of the cooling blocks and the heater back when the cooling blocks contacted with the heater were 5°; the corners of the abutment faces were chamfered to 50 μm; and the angles made between the abutment faces of the cooling blocks and the back of the heater when the cooling blocks were separated from the heater and were stationary were 5°. On the lines of intersection, where a cylindrical face, which had a center line normal to the wafer carrying face of the heater and extended through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value.

In the cooling blocks, moreover, the passage was formed with a sectional area of 25 mm$^2$ over its entire length. The passage had an area 15% as large as that of the abutment face, and was formed on the inner side from the position of 20 mm from the outer edge of the abutment face. The cooling blocks were fed with water in a quantity of 1,000 cc/min. while the heater was heating and was being held and cooled.

The cooling blocks used had changed surface roughnesses (Ra) of the faces, with which the liquid in the passage of the cooling blocks contacted, as enumerated in Table X. After the heater had been heated to 400° C. as the measured value of the thermocouples, it was held at 400° C. for 30 minutes to stabilize the temperature. The power feed was then stopped, and the cooling blocks were brought into contact thereby to cool the heater to 50° C. There were measured: the temperature dispersion of the wafer carrying face at the time when the measured value of the thermocouples reached 250° C.; the temperature dispersion of the wafer carrying face at the time when the measured value reached 50° C.; and the cooling capacity.

The results obtained are enumerated in Table X together with the surface roughness (Ra) of the faces, with which the liquid in the passage of the cooling blocks contacted. It is found that the homogeneity of the temperature on the wafer carrying face of the heater and the cooling capacity are highly improved when the surface roughness Ra of the faces to be contacted with by the liquid in the passage is within a range of 0.02 to 100 μm.

TABLE X

| Sample number | Surface roughness Ra (μm) of inner face of passage | Temperature dispersion (° C.) at cooling time | | Cooling capacity (secs.) |
|---|---|---|---|---|
| | | at 250° C. | at 50° C. | |
| 44 | 0.01 | 1.6 | 0.3 | 2864 |
| 45 | 0.02 | 1.6 | 0.3 | 1543 |
| 46 | 0.05 | 1.6 | 0.3 | 1531 |
| 47 | 0.1 | 1.6 | 0.3 | 1526 |
| 48 | 0.5 | 1.6 | 0.3 | 1518 |
| 49 | 1 | 1.6 | 0.3 | 1511 |
| 50 | 5 | 1.6 | 0.3 | 1505 |
| 51 | 10 | 1.5 | 0.2 | 1498 |
| 52 | 80 | 1.6 | 0.3 | 1522 |
| 53 | 100 | 1.6 | 0.3 | 1532 |
| 54 | 200 | 6.0 | 1.1 | 3081 |

Example 11

In addition to the aluminum nitride (AlN) heater thus far described, the heaters made of aluminum oxide ($Al_2O_3$), silicon carbide (SiC) and silicon nitride ($Si_3N_4$) and having the same shape were prepared in similar manners. In the cooling blocks used, on the other hand: the abutment faces of the cooling blocks, against which the heater abutted, had a warpage of 0.02 mm; the angles made between the abutment faces of the cooling blocks and the heater back when the cooling blocks contacted with the heater were 5°; the corners of the abutment faces were chamfered to 50 μm; and the angles made between the abutment faces of the cooling blocks and the back of the heater when the cooling blocks were separated from the heater and stood still were 5°. On the lines of intersection, where a cylindrical face, which had a center line normal to the wafer carrying face of the heater and extended through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value.

In the cooling blocks, moreover, the passage was formed with the sectional area of 25 mm$^2$ over its entire length. The passage had an area of 15% as large as that of the abutment face, and was formed on the inner side from the position of 20 mm from the outer edge of the abutment face. The passage had a surface roughness Ra of 0.2 μm on its face, with which the fluid therein contacted. The cooling blocks were fed with water in a quantity of 1,000 cc/min. while the heater was heating and was being held and cooled.

After the heater had been heated to 400° C. as the measured value of the thermocouples, it was held at 400° C. for 30 minutes to stabilize the temperature. The power feed was then stopped, and the cooling blocks were brought into contact thereby to cool the heater to 50° C. There were measured: the temperature dispersion of the wafer carrying face at the time when the measured value of the thermocouples reached 250° C.; and the temperature dispersion of the wafer carrying face at the time when the measured value reached 50° C. Moreover, the aforementioned heating and cooling tests were repeated 1,000 times at the maximum, and the numbers of tests until the heater was broken were examined.

The results obtained are numerated in Table XI together with the materials of the heater. It is found that the aluminum nitride and the silicon carbide are excellent for the homogeneity of the temperature on the wafer carrying face of the heater, and that the aluminum nitride and the silicon nitride are excellent for the reliability evaluated by the aforementioned repeated tests. It is also found that the aluminum nitride of those materials has both the homogeneity of the temperature and the reliability.

TABLE XI

| Sample number | Heater material | Temperature dispersion (° C.) at cooling time | | Test number until heater breakage |
|---|---|---|---|---|
| | | at 250° C. | at 50° C. | |
| 55 | AlN | 1.6 | 0.3 | Not broken |
| 56 | $Al_2O_3$ | 8.2 | 2.5 | 698 |
| 57 | SiC | 2.6 | 0.6 | 842 |
| 58 | $Si_3N_4$ | 7.9 | 2.4 | Not broken |

Example 12

Like the cooling blocks of aluminum, cooling blocks of five kinds of materials were prepared, as enumerated in Table XII. In the cooling blocks used: the abutment faces of the cooling blocks, against which the heater abutted, had a warpage of 0.02 mm; the angles made between the abutment faces of the cooling blocks and the heater back when the cooling blocks contacted with the heater were 5°; the corners of the abutment faces were chamfered to 50 µm; and the angles made between the abutment faces of the cooling blocks and the back of the heater when the cooling blocks are separated from the heater and were stationary were 5°. On the lines of intersection, where a cylindrical face, which had a center line normal to the wafer carrying face of the heater and extended through the center of the wafer carrying face and had a radius shorter than the distance from the center to the outer edge of the wafer carrying face, and an arbitrary plane, which was normal to the wafer carrying face and extended through the center of the wafer carrying face, intersected each other, the length from the wafer carrying face on that intersecting line to the container inner face of the semiconductor manufacturing device was adjusted to 0.97 to 1.03 times as large as its average value.

In the cooling blocks, moreover, the passage was formed with the sectional area of 25 mm² over its entire length. The passage had an area 15% as large as that of the abutment face, and was formed on the inner side from the position of 20 mm from the outer edge of the abutment face. The passage had a surface roughness Ra of 0.2 µm on its face, with which the fluid therein contacted. The cooling blocks were fed with water in a quantity of 1,000 cc/min. while the heater was heating and was being held and cooled.

After the heater made of aluminum nitride had been heated to 400° C. as the measured value of the thermocouples, it was held at 400° C. for 30 minutes to stabilize the temperature. The power feed was then stopped, and the cooling blocks were brought into contact thereby to cool the heater to 50° C. There were measured: the temperature dispersion of the wafer carrying face at the time when the measured value of the thermocouples reached 250° C.; and the temperature dispersion of the wafer carrying face at the time when the measured value reached 50° C.

The results obtained are enumerated in Table XII together with the materials and the thermal conductivities of the cooling blocks. It is found that the homogeneity of the temperature on the wafer carrying face of the heater is improved across the thermal conductivities of 30 W/mK and 100 W/mK of the materials making the cooling blocks.

TABLE XII

| | Cooling Block | | | |
|---|---|---|---|---|
| Sample number | Material | Thermal conductivity (Wm/K) | Temperature dispersion (° C.) at cooling time | |
| | | | at 250° C. | at 50° C. |
| 59 | Cr—Ni Steel | 17 | 5.4 | 1.2 |
| 60 | Ni steel | 30 | 3.2 | 0.7 |
| 61 | Pure iron | 75 | 3.1 | 0.6 |
| 62 | Al casting | 100 | 1.6 | 0.3 |
| 63 | Pure Al | 200 | 1.4 | 0.3 |

INDUSTRIAL APPLICABILITY

For the wafer holder for executing various treatments while heating the semiconductor wafer carried thereon, according to the invention, it is possible to improve the cooling rate of the heater and to retain the homogeneity of the temperature distribution of the heater from the start to the end of the cooling operation. It is, therefore, possible to provide a semiconductor manufacturing device, which is provided with that wafer holder and which can shorten the treating of the semiconductor wafer drastically.

The invention claimed is:

1. A semiconductor manufacturing device comprising a wafer holder including a heater for placing a semiconductor wafer thereon to heat the same, and a cooling block for cooling the heater, characterized in that:
   the cooling block is arranged so as to come into and out of abutment against the back of the heater on the side opposed to the wafer carrying face; and
   the abutment face of the cooling block to abut against the heater has a warpage of 1 mm or less.

2. A semiconductor manufacturing device according to claim 1, characterized in that the warpage of the abutment face of said cooling block to abut against the heater is 0.2 mm or less.

3. A semiconductor manufacturing device according to claim 2, characterized in that the warpage of the abutment face of said cooling block to abut against the heater is 0.05 mm or less.

4. A semiconductor manufacturing device according to claim 1, characterized in that the angle made between the abutment face of the cooling block and the back of the heater when said cooling block moves to contact with the heater is 10° or less.

5. A semiconductor manufacturing device according to claim 1, characterized in that the abutment face of said cooling block to abut against the heater is chamfered at its corners to 10 µm or larger.

6. A semiconductor manufacturing device according to claim 1, characterized in that the angle made between the abutment face of the cooling block and the back of the heater when said cooling block is separated from the heater and is stationary is 10° or less.

7. A semiconductor manufacturing device according to claim 1, characterized in that, on the lines of intersection, where a cylindrical face, which has a center line normal to the wafer carrying face of the heater and extends through the center of the wafer carrying face and has a radius shorter than the distance from the center to the outer edge of the wafer carrying face, and an arbitrary plane, which is normal to the wafer carrying face and extends through the center of the wafer carrying face, intersect each other, the length from the wafer carrying face on that intersecting line to the container inner face of the semiconductor manufacturing device is within a range of 0.9 to 1.1 times as large as its average value.

8. A semiconductor manufacturing device according to claim 1, characterized in that said cooling block is provided therein with a passage for a cooling liquid.

9. A semiconductor manufacturing device according to claim 8, characterized in that said passage has a sectional area of 1 mm$^2$ or larger over 80% of its entire length.

10. A semiconductor manufacturing device according to claim 8, characterized in that the area of the portion having said passage formed is 3% or larger of the entire area of the abutment face of the cooling block, against which the heater abuts, when viewed in the direction normal to the abutment face.

11. A semiconductor manufacturing device according to claim 8, characterized in that said passage is formed within a range of 50 mm or less on the inner side of the outer edge of the abutment face of the cooling block, against which the heater abuts, when viewed in the direction normal to the abutment face.

12. A semiconductor manufacturing device according to claim 8, characterized in that said passage has a surface roughness within a range of 0.02 to 100 μm in terms of Ra on the face, with which the liquid contacts.

13. A semiconductor manufacturing device according to claim 8, characterized in that the liquid to be fed to said passage has a flow rate of 500 cc/mm. or higher.

14. A semiconductor manufacturing device according to claim 1, characterized in that the material making said cooling block has a thermal conductivity of 30 W/mK or higher.

15. A semiconductor manufacturing device according to claim 14, characterized in that the material making said cooling block has a thermal conductivity of 100 W/mK or higher.

16. A semiconductor manufacturing device according to claim 1, characterized in that the material making said heater has a main component selected from any of the group consisting of aluminum nitride, aluminum oxide, silicon carbide and silicon nitride.

17. A semiconductor manufacturing device according to claim 16, characterized in that the material making said heater is composed mainly of aluminum nitride.

* * * * *